(12) United States Patent
Liu et al.

(10) Patent No.: US 8,120,169 B2
(45) Date of Patent: Feb. 21, 2012

(54) THERMALLY ENHANCED MOLDED LEADLESS PACKAGE

(75) Inventors: Yong Liu, Scarborough, ME (US); Zhongfa Yuan, Suzhou (CN)

(73) Assignee: Fairchild Semiconductor Corporation, South Portland, ME (US)

( * ) Notice: Subject to any disclaimer, the term of this patent is extended or adjusted under 35 U.S.C. 154(b) by 502 days.

(21) Appl. No.: 12/037,428

(22) Filed: Feb. 26, 2008

(65) Prior Publication Data

US 2009/0212403 A1   Aug. 27, 2009

(51) Int. Cl.
 *H01L 23/34*   (2006.01)
(52) U.S. Cl. .................. 257/712; 257/713; 257/E23.08
(58) Field of Classification Search .................. 257/675, 257/690
See application file for complete search history.

(56) References Cited

U.S. PATENT DOCUMENTS

| | | | | |
|---|---|---|---|---|
| 4,679,118 A | * | 7/1987 | Johnson et al. | 361/718 |
| 4,730,666 A | * | 3/1988 | Flint et al. | 165/80.4 |
| 6,400,004 B1 | * | 6/2002 | Fan et al. | 257/666 |
| 7,190,066 B2 | | 3/2007 | Huang et al. | |
| 2007/0034994 A1 | * | 2/2007 | Choi | 257/666 |
| 2007/0132091 A1 | | 6/2007 | Wu et al. | |

* cited by examiner

*Primary Examiner* — Marcos D. Pizarro
*Assistant Examiner* — Eva Yan Montalvo
(74) *Attorney, Agent, or Firm* — Hiscock & Barclay, LLP

(57) ABSTRACT

A molded leadless package (MLP) semiconductor device includes a heat spreader with a single connecting projection extending from an edge of a cap of the heat spreader to a leadframe. The heat spreader can include additional projections on its edges that act as heat collectors and help to secure the spreader in the MLP. The connecting projection is attached to a lead of the leadframe so that heat gathered by the cap can be transferred through the connecting projection to the lead and to a printed circuit board to which the lead is connected. In embodiments, the heat spreader includes a central heat collector projection from the cap toward the die, preferably in the form of a solid cylinder, that enhances heat collection and transfer to the cap. The cap can include fins projecting from its top surface to facilitate radiant and convection cooling.

27 Claims, 8 Drawing Sheets

THERMALLY ENHANCED MOLDED LEADLESS PACKAGE

BACKGROUND AND SUMMARY

1. Field of the Invention

The present invention relates to a packaged semiconductor, and more particularly, to packaged semiconductor devices and integrated circuits for removing excess heat from the devices and integrated circuits.

2. Description of the Related Art

Generally, semiconductor devices include and are not limited to integrated circuit (IC) devices, diodes, thyristors, or MOS gate devices, for example, metal-oxide-semiconductor field effect transistors (MOSFET) and insulated gate bipolar transistors (IGBT). Each are formed in a silicon semiconductor die. In vertical MOSFET devices, the die includes a metal drain electrode at its lower portion, and a metal source electrode, and a gate electrode on its top surface. In that special case, the die pad of the MOSFET may also be a lead. The device die or IC die is attached to a surface of a leadframe pad, and electrodes on the die are electrically connected to leads of the leadframe by a wire bonding. The leadframe temporarily holds the leads in place. A typical leadframe has two parallel rails with a number of cross rails. A die pad in the center is supported by tie bars that extend from the rails toward the center of the frame. Other leads extend from The leads extend from the rails toward the center of the frame but do not support the die. Consequently, the electrodes on the die are electrically connected to proximate ends of leads of the leadframe. The distal ends of the leads protrude out of a molded housing. The silicon semiconductor die and the wire are completely molded in the housing.

A conflict arises since there is a demand for smaller and smaller semiconductor devices, while speed, power, and capacity are expected to increase. Various solutions have arisen to provide compromise solutions. For example, one problem that can arise is heat dissipation. Since electronic components, such as diodes and ICs, produce heat, it is important to have a way to remove heat from the components to prevent overheating, which can adversely affect performance of the components or even cause them to fail. Prior art arrangements offer heat dissipation arrangements, but it is always desirable to have more efficient heat dissipation allowing electronic components to operate at lower temperatures when feasible and not overly expensive.

An example of such a heat dissipation solution is shown in FIG. 1. In FIG. 1, a semiconductor device 10 includes a die 11 attached to a premolded leadframe 12 via a die attach die bonding material 13, such as an epoxy based bonding material. The premolded leadframe 12 includes a plurality of leads 14 and an attach area 15 on the top surface of the premolded leadframe 12 and is underfilled with a molding compound, such as an epoxy resin, electronic molding compound (EMC), or the like, so that the leads on the leadframe are supported by the material. The die 11 is attached to the attach area 15 via wires 22 bonded to the die 11 by known wire bonding techniques. The die 11, premolded leadframe 12, and bonded wires are encased in EMC and the leads are cut to form terminals 23 of the device 10. While the leads 14 and terminals 23 conduct heat away from the die 11 and transfer it to conductors to which they are attached, heat can still undesirably build up in the device 10 since the only heat path from the die to the leads is the premold material on the leadframe and the EMC applied to the entire assembly, reducing performance and possibly resulting in failure of the device 10.

Another approach is disclosed in U.S. Pat. No. 7,190,066 to Huang et al. in which a round top heat spreader is disposed over a die, but the spreader only extends part way across the die and the device as a whole. Further, the substrate does not allow for transfer of heat from the spreader to the bottom of the device since it employs ball grid array (BGA) balls and does not have leads extending through the entire depth of the substrate.

A further approach is disclosed in U.S. PreGrant Publication No. 20070132091 to Wu et al. in which an upper heat sink includes a depression over the die and is connected to the substrate by four leads. However, while there is dissipation via the top surface of the upper heat sink, no provision is made to conduct heat from the upper heat sink to the bottom of the device for enhanced heat dissipation.

Embodiments disclosed herein provide a thermally enhanced MLP that uses heat conductive material shaped into a heat spreader and placed in the MLP so as to conduct more heat away from the die embedded therein, enhancing performance and lengthening the life of the device. The heat spreader is preferably in thermal communication with at least one of the leads of the device and occupies at least a portion of the top of the device, allowing radiant cooling or connection of the spreader to heat pipes or other cooling arrangements. In one form, the spreader is simply a layer of thermally conductive material with projections extending toward the leadframe, at least one of the projections serving as a support during assembly and as a connector and thermal conduit from one or more of the leads. In another form, the heat spreader projections are eliminated save for the support/conduit/connector and a central heat collector positioned in the center of the spreader over the center of the die. The support/conduit/connector is sized so that the heat collector is spaced apart from the die, but can collect heat produced by the die and direct it to the top surface of the device. The top surface can then radiate heat or be connected to heat pipes or other cooling arrangements. Fins can be employed in embodiments to enhance cooling, such as by convection and radiation. The resulting device allows the die to operate at a lower temperature than prior arrangements.

Advantageously, an improved leadframe can be employed in embodiments to further enhance thermal communication between the die, the heat spreader, and the leadframe. The improved leadframe includes lead portions that are in direct thermal communication with the die and preferably also includes at least one enlarged lead in direct thermal communication with the heat spreader. The enlarged lead(s) provide additional heat carrying capacity to better dissipate heat transferred to the lead. The improved leadframe even further lowers operating temperature of the die.

DESCRIPTION

Figure 2:
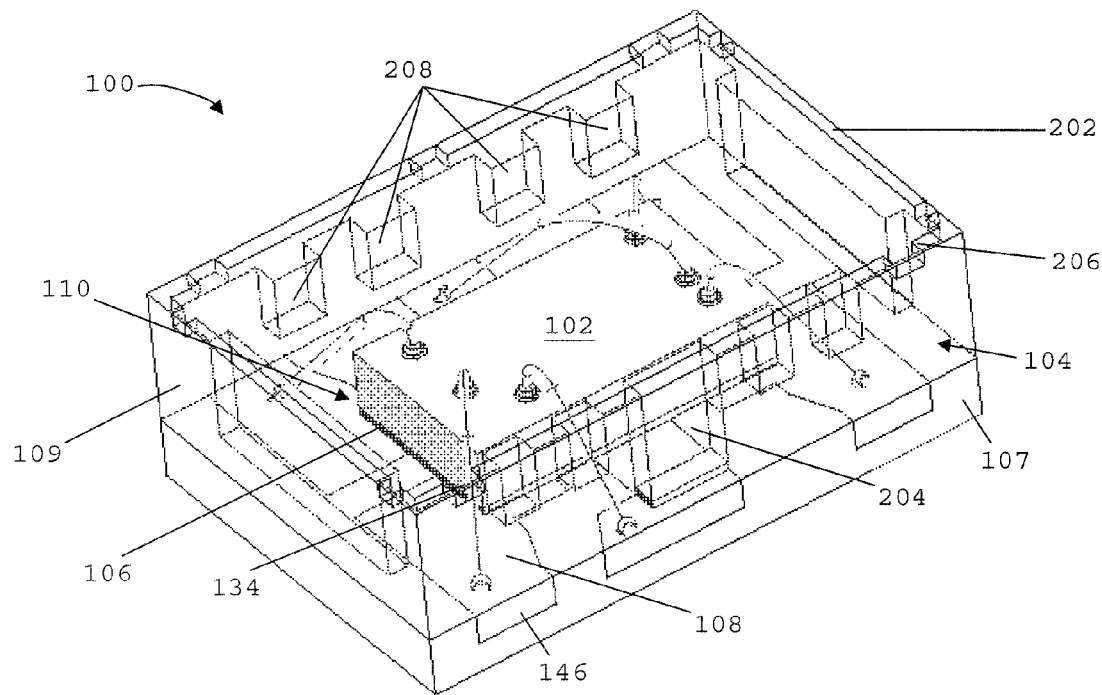
FIG. 2 is a schematic perspective view of a completed MLP according to embodiments disclosed herein.

With reference to the accompanying FIGS., and FIG. 2 in particular, a semiconductor device in the form of a molded leadless package (MLP) 100 according to embodiments includes a die 102 attached to a thermally enhanced substrate 104, such as a premolded leadframe, via a bonding material 106, such as an epoxy encapsulating material, also called die bonding material. The substrate 104 includes a plurality of leads 108 and is underfilled with a molding compound, such as electrically insulating electronic mold compound 107 or the like.

The die 102 is preferably electrically connected to the leads 108 via wires 134 bonded to the die 102 by known wire bonding techniques. While normal wire bonding is preferred, other techniques can be applied. For example, ball stitch on bump bonding can be used instead to reduce bond wire loop height by as much as 50% should such reduction be required or desired. While copper and aluminum wires can be used, embodiments preferably employ gold wires since gold wires produce stronger bonds and lower electrical resistance than other metals. While wires and wire bonding are shown in the exemplary embodiment, other electrical connections could be used instead. It is within the purview of the invention to employ flip chip techniques, for example.

Figure 3:
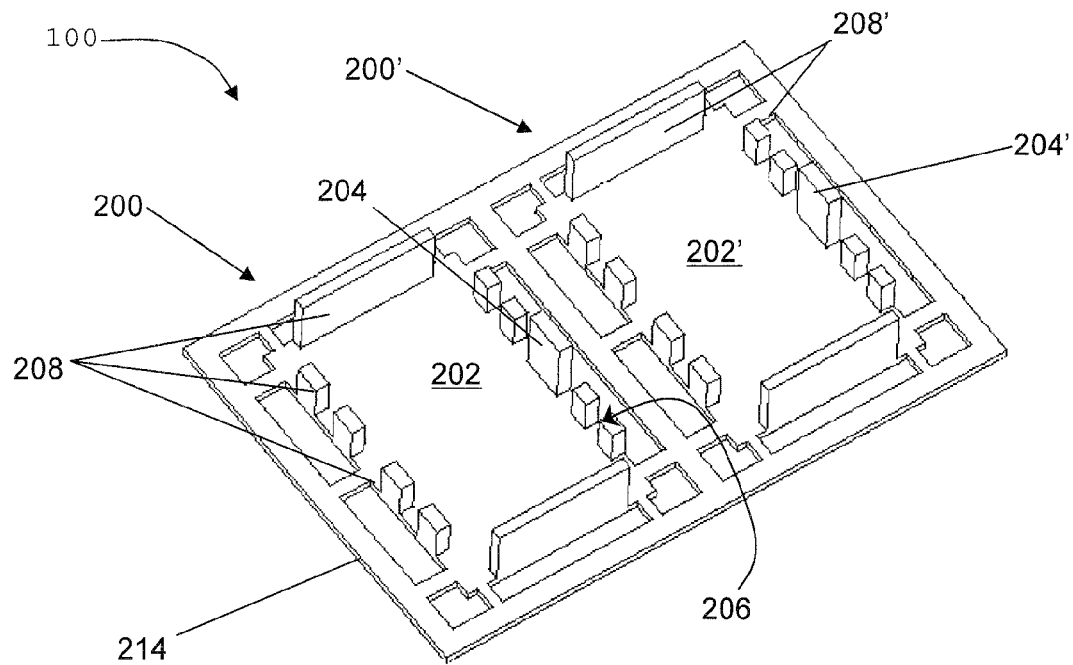
FIG. 3 is a schematic perspective view of the bottom of a frame bearing two heat spreaders according to embodiments disclosed herein.
Figure 4:
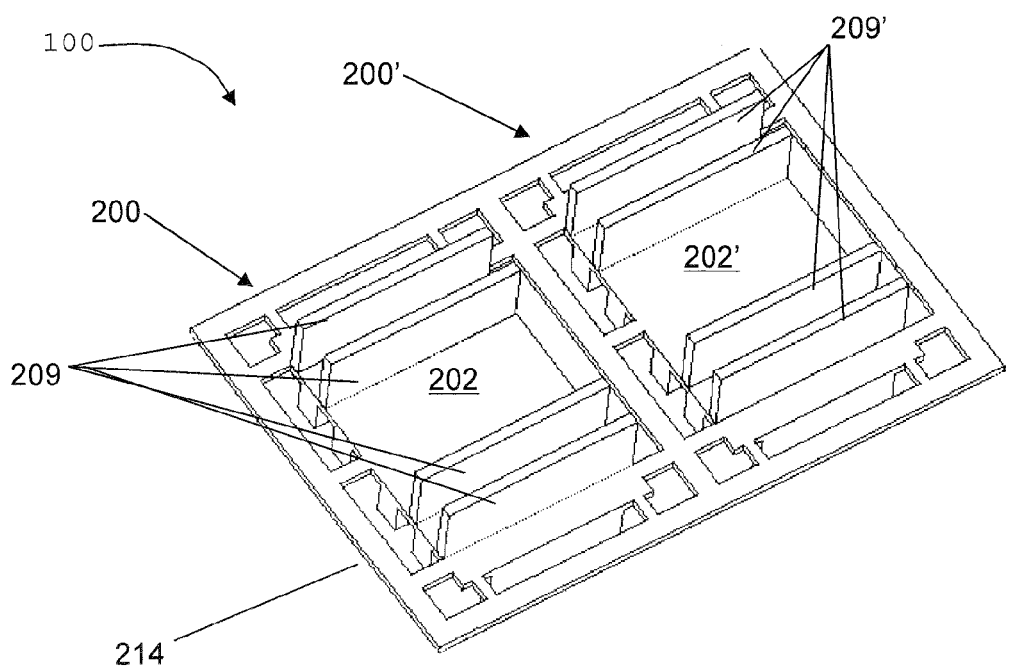
FIG. 4 is a schematic perspective view of the top of a frame bearing two heat spreaders according to embodiments disclosed herein, the heat spreaders including fins.

As seen particularly in FIGS. 2-4, a heat spreader 200 according to embodiments includes a cap 202 comprising a layer of thermally conductive material, preferably rectangular in shape, placed over the die 102. A connecting projection 204 extends from the bottom of the cap 202 to connect to one of the leads 108. Preferably, the connecting projection 204 is located along an edge 206 of the cap, such as about half way along such an edge 206. Additional projections 208, which act has peripheral heat collectors, can be included along one or more edges of the layer 202 to collect additional heat from the body of the MLP and to better secure the spreader 200.

The particular number, size, and shape of the projections can vary depending on the needs of a particular MLP, but preferably the projections 204, 208 are rectangular in shape.

The projections 204, 208 can be formed by various methods, such as by cutting, stamping, precise casting and molding, or even by MEMS-related technologies, such as chemical etching, but preferably are formed by stamping. For example, the projections 204, 208 can be stamped from a sheet at a uniform length after which all but the connecting projection 204 are trimmed to their final lengths. The bottom of the connecting projection 204 is preferably connected to a respective lead 108 with thermally conductive bonding material, such as solder, epoxy, thermal paste, or other suitable material. As indicated above, to enhance the connection from the spreader 200, the lead to which the connecting projection 204 is attached can be extended to match or exceed the dimension of the connection projection 204.

The die 102, substrate 104, bonded wires 134, and heat spreader 200 are encased in molding compound 109, such as electronic molding compound, to form the body of the MLP 100, as seen in FIG. 2, and the leads 108 are cut to form terminals 146 of the device 100. If a premolded leadframe is used as the substrate 104, the compound used to form the body of the MLP 100 need not be the same as the compound employed in the premolded leadframe if the requirements of a particular application would be better met by employing different materials. The completed MLP has one heat path from the die 102 through the heat collectors 208 to the cap 202. From the cap 202, heat can be transferred to the surroundings, such as air, but heat also can move through the at least one connecting projection 204 to the substrate 104. Another heat path of the MLP 100 includes the die attach areas 110 of the leads 108: heat passes from the die to the die attach areas 110, then through the leads 108 to the surroundings, such as a printed circuit board.

To ease assembly of the device 100 with the spreader 200, with particular reference to FIGS. 3 and 4, two or more spreaders 200, 200' are formed in a frame 214 for assembly with a premolded leadframe 160 seen in later FIGS. with leads and attachment areas for respective numbers of dies 102, 102'. The spreaders 200, 200' are preferably supported by tie bars as is known in the art. As seen in FIG. 4, fins 209, 209' can be formed projecting from the top surface of each cap 202, 202' to enhance heat dissipation. The fins 209, 209' can be formed from any of the methods by which the projections 204, 208 can be formed and additionally can be formed separately and then attached, such as with adhesive, but are preferably formed by stamping.

Figure 5:
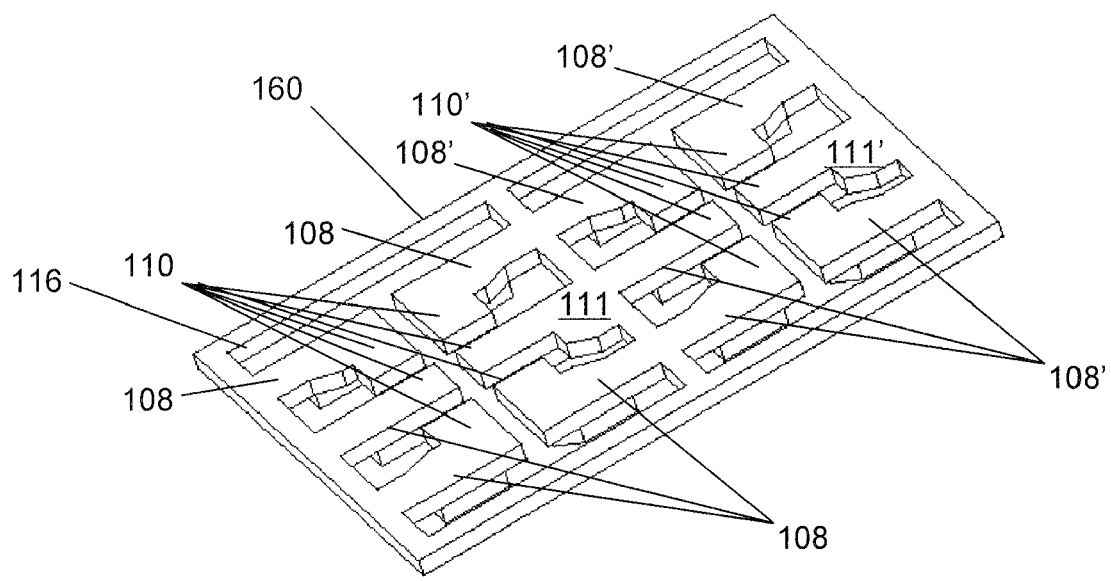
FIG. 5 is a schematic perspective view of the top of a leadframe of a MLP according to embodiments disclosed herein.
Figure 6:
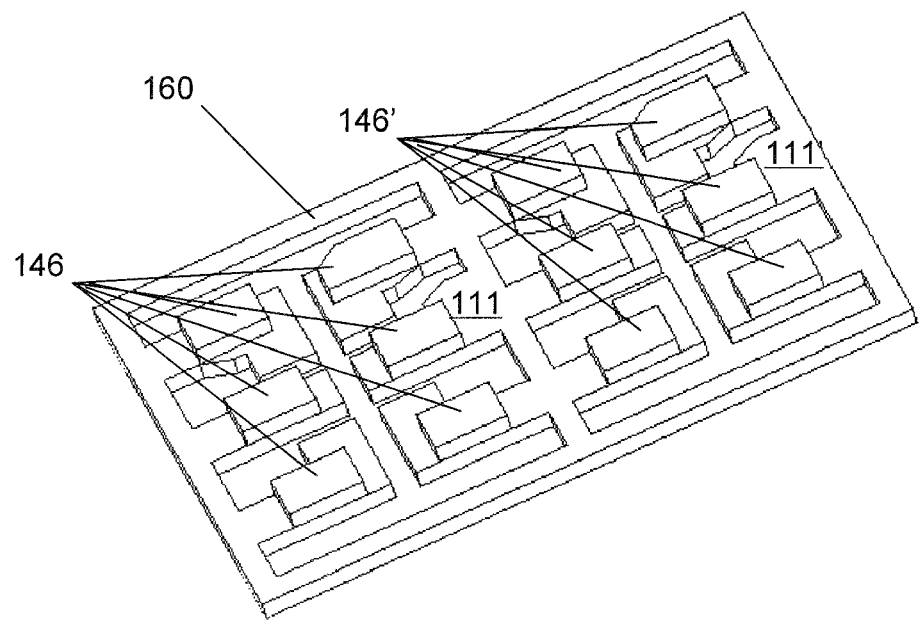
FIG. 6 is a schematic perspective view of the bottom of a leadframe of a MLP according to embodiments disclosed herein.
Figure 7:
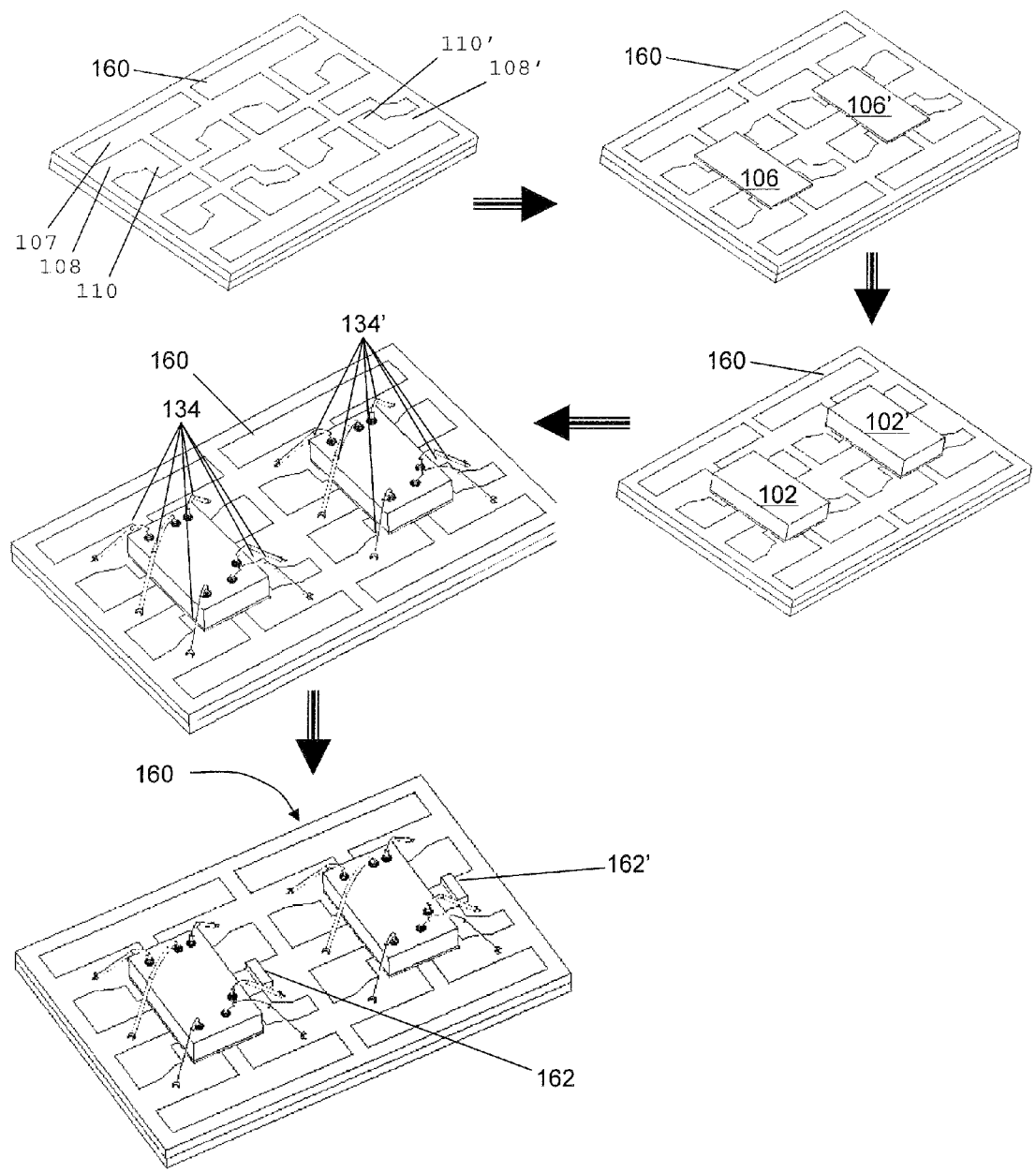
FIG. 7 is a schematic illustration of a portion of a method of assembling a semiconductor device according to embodiments disclosed herein.

As seen particularly in FIGS. 5-7, a preferred substrate can be a premolded leadframe 160 that includes two sets of leads 108, 108' each arranged in an asterisk-like pattern and supported by tie bars. As mentioned, while two sets are shown and two spreaders are shown, more or fewer can be used as appropriate. The asterisk-like pattern of the leads 108, 108' results in part from extension of the leads 108, 108' toward the center of the set of leads to form die attach areas 110, 110'. The die attach areas 110, 110' are in thermal communication with the die 102, 102' once the die 102, 102' is attached. The inclusion of die attach areas 110, 110' on the leads 108, 108' allows the premolded leadframe 160 to have better thermal performance than prior art arrangements with the added benefit of better accommodation of the attachment of the die 102. To even further enhance thermal performance of the leadframe 160, one or more of the leads can be enlarged, such as enlarged lead 111, 111', to provide greater heat carrying capacity as will be explained below. Embodiments can also include terminals of the leads 108, 108' that extend to the bottom surface of the leadframe, providing an additional path for heat dissipation and/or for electrical connection to the die. As such, this embodiment has no die pad, per se, but rather uses the ends of the leads proximate the die to support the die. The leads are longer than conventional leads and extend below the die pad and provide a surface for receiving and supporting a portion of the die.

The electrically conductive portions of the leadframe 160 are preferably coated with a material such as nickel, zinc, gold, palladium, and/or another suitable material or an alloy or other combination thereof. The EMC 107 of the premolded leadframe 104 is preferably applied substantially prior to attachment of the die 102 so that the premolded leadframe is supplied ready for attachment of the die 102. Preferably, the MLP 100 of at least one embodiment has six attach areas 110 at the ends of six respective leads 108 of the leadframe 160, though more or fewer attach areas and/or leads can be employed as befits a particular arrangement.

Figure 8:
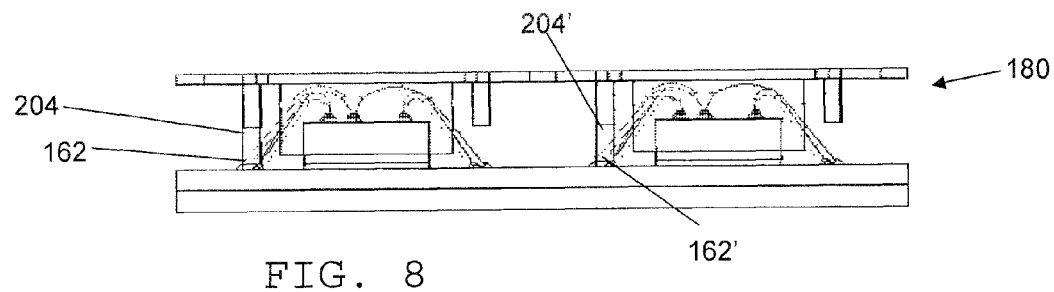
FIGS. 8 and 9 schematically illustrate the joined components including a heat spreader according to embodiments disclosed herein and prior to molding.
Figure 9:
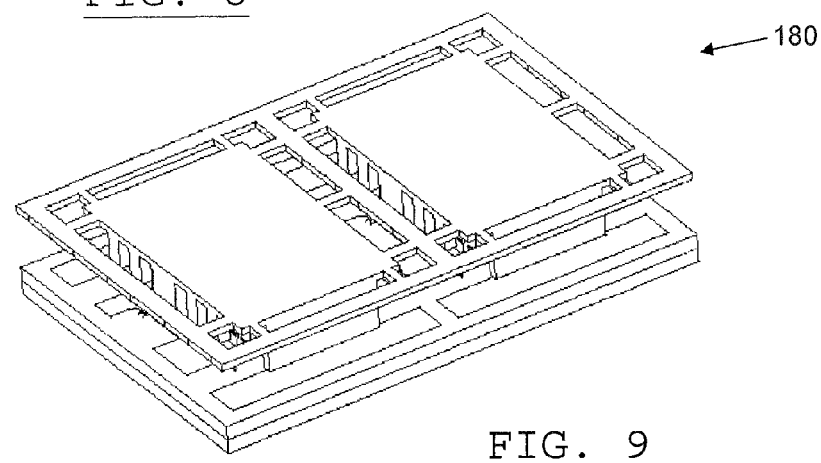
Figure 10:
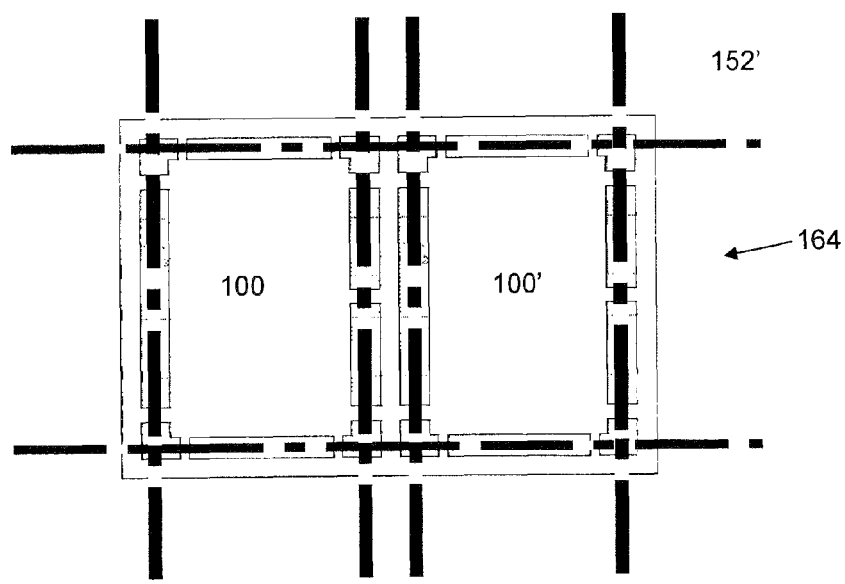
FIG. 10 is a schematic top view of the joined components of FIGS. 11 and 12 after molding and indicating saw lines.
Figure 11:
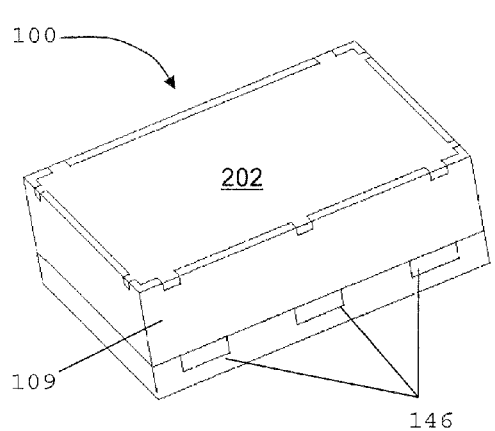
FIG. 11 is a schematic perspective view of a completed MLP including a heat spreader according to embodiments disclosed herein.
Figure 12:
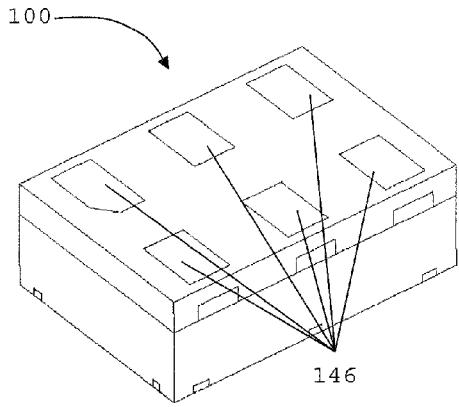
FIG. 12 is a schematic perspective view of the completed MLP of FIG. 14 showing the bottom of the MLP.
Figure 13:
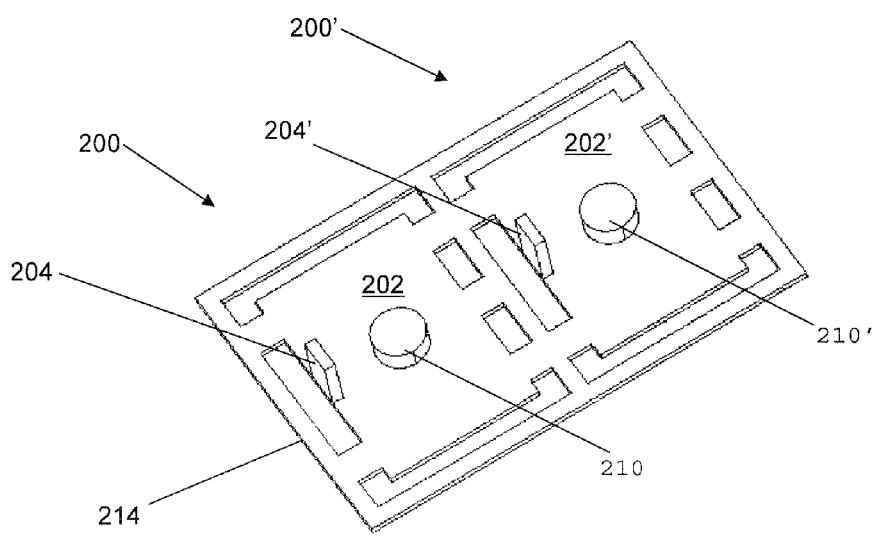
FIG. 13 is a schematic perspective view of the bottom of a frame bearing two heat spreaders that each include a collector according to embodiments.

Preferably, as seen particularly in FIG. 7, assembly comprises providing a substrate 104, such as a premolded leadframe 160 that includes two sets of leads 108, 108' with die attach areas 110, 110', placing die attach material 106, 106', such as an encapsulating die attach material, on the premolded leadframe 160 and die attach areas 110, 110'. Alternatively, the premolded leadframe 160 can be supplied with die attach material 106, 106' already in place. However the die attach material 106, 106' is provided, assembly proceeds by bonding the dies 102, 102' to the premolded leadframe 160 via the die attach material 106, 106', and attaching wires 134, 134' to the dies 102, 102' and to the leads 108, 108'. As mentioned above, the wires 134, 134' are preferably attached via known wire bonding techniques that can include ball stitch on bump techniques to reduce wire loop height. Bonding material 162 is then placed on the leads to which the spreaders 200, 200' will be attached, such as enlarged leads 111, 111'. The spreaders 200, 200' are then placed on the bonding material 162, which connects the spreaders 200, 200' to the premolded leadframe 160 and forms an intermediate assembly 180 seen in FIGS. 8 and 9. The intermediate assembly 180 includes two complete sets of components for two packages 100, 100'. Electrically insulating molding compound 109, which need not be the same material as the premolded leadframe EMC 107, is injected into the intermediate assembly 180 to fill the spaces between the components and the leadframe and to provide a body assembly 164 for the MLPs, as seen in FIG. 10. The body assembly 164 is then singulated, such as by sawing to remove the frames, separate the MLPs 100, 100', and expose the terminals of the MLPs, as seen in FIGS. 11-12.

Figure 14:
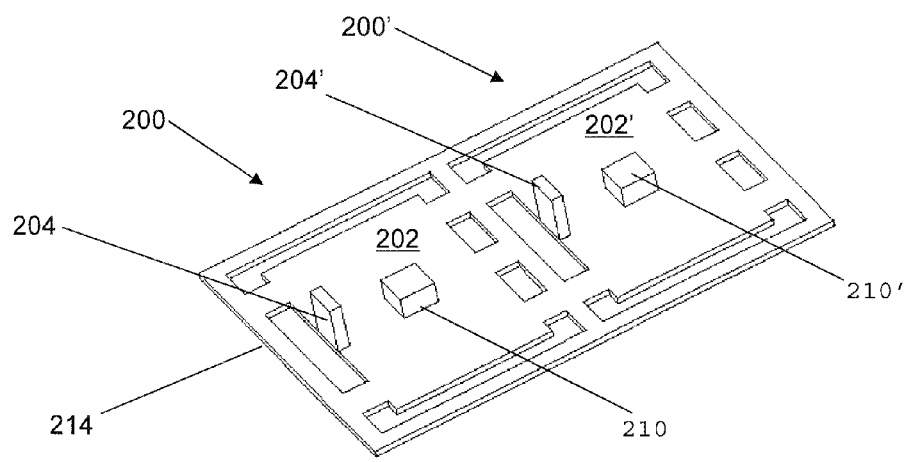
FIG. 14 is a schematic perspective view of the bottom of a frame bearing two heat spreaders that each include a collector with an alternate shape according to embodiments.
Figure 15:
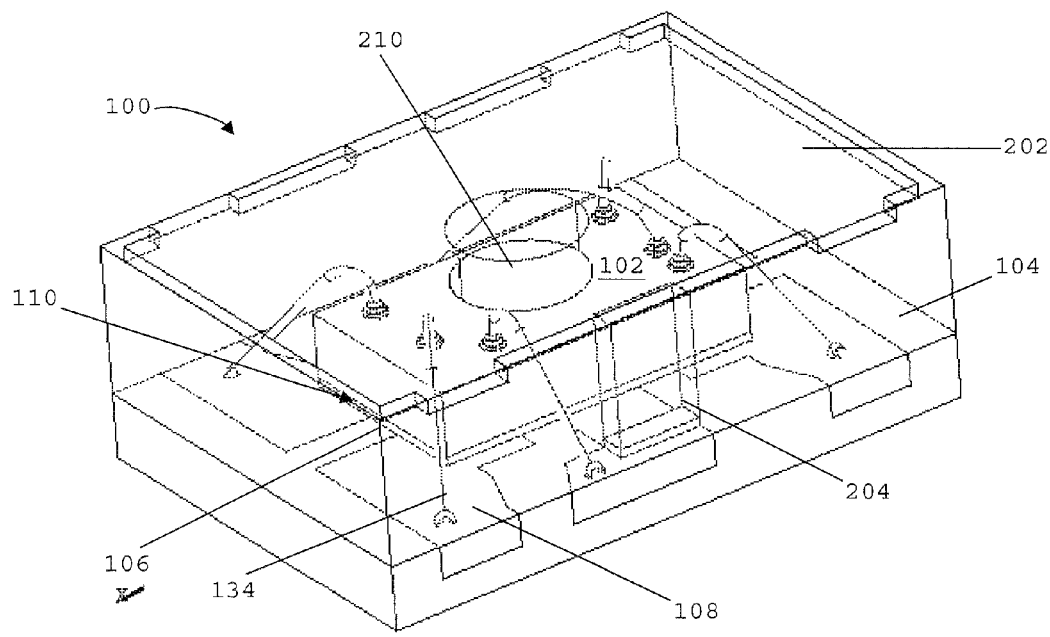
FIGS. 15 and 16 schematically illustrate a complete MLP including a heat spreader with a collector as seen is FIG. 16 and showing an interior of the MLP according to embodiments.
Figure 16:
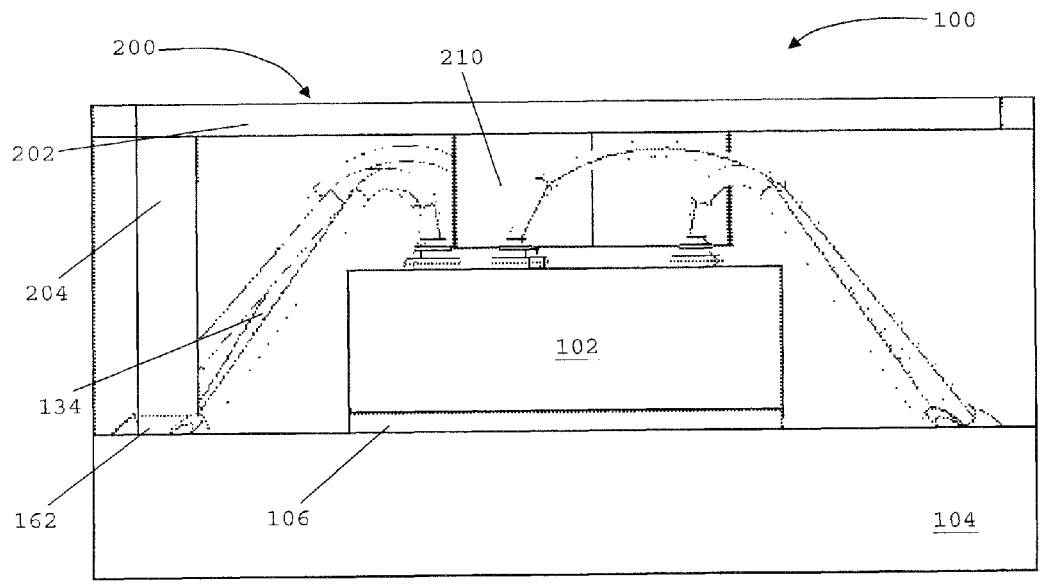
Figure 17:
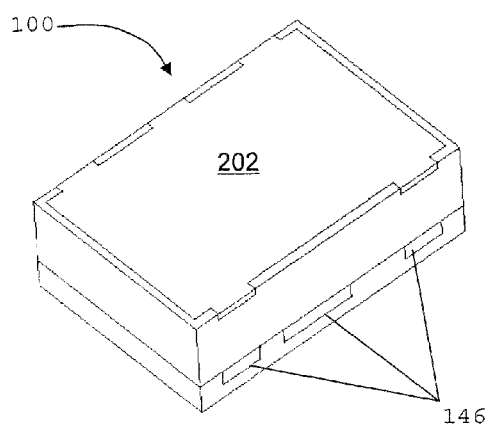
FIGS. 17 and 18 are schematic perspective views of the completed MLP with a heat spreader including a collector showing the top and bottom of the MLP according to embodiments.
Figure 18:
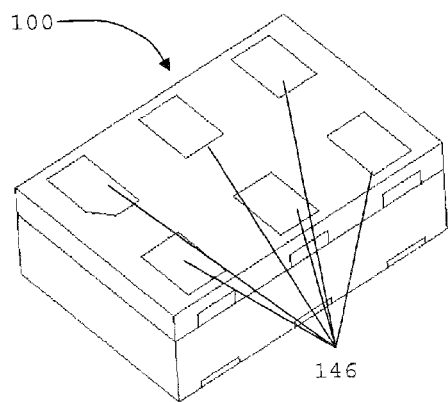

In embodiments, as seen particularly in FIGS. 13-18, the cap 202 can include a collector 210 extending from the cap 202 toward the die 102. Preferably, the collector 210 is centrally located on the bottom of the cap. While the collector 210 is shown as being circular, it can have any suitable shape. One alternative shape for the collector 210 is a rectangular shape as seen in FIG. 14. In embodiments including a collector 210 and a connecting projection 204 to connect the heat spreader cap 202 to the bottom lead. Other projections can be omitted, though the cap 202 will preferably include tabs 208 to secure the spreader 200 in the device 100 as in FIG. 3.

Figure 1:
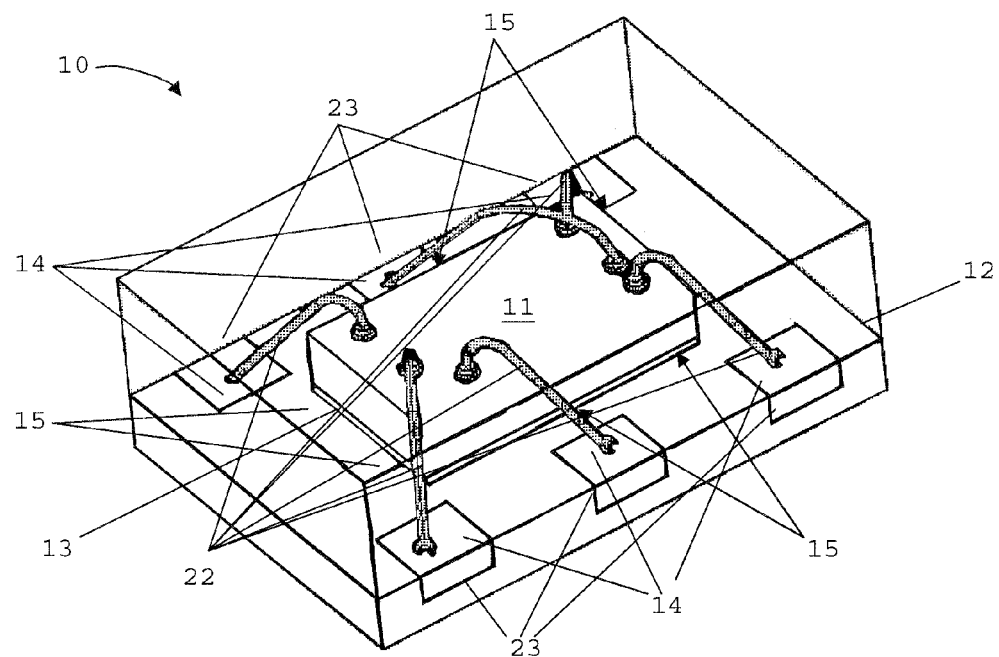
FIG. 1 is a schematic perspective view that illustrates a prior art molded leadless package (MLP).

With the heat spreader 200 of embodiments in place, heat produced by the die 102 is gathered by the cap 202 and transferred to the surroundings via a first heat path. Additionally, heat is transferred through a second heat path including the connecting projection 204, the lead to which the projection 204 is connected, and a printed circuit board to which the lead is attached. Simulations of embodiments in operation indicate significant improvement in thermal dissipation. For example, the prior art design shown in FIG. 1 yields a thermal resistance of approximately 456° C./W. However, embodiments, those that use the collector 210 and those that do not, yield a thermal resistance of approximately 268° C./W. Thus, employing the heat spreader 200 produces an improvement in thermal resistance on the order of 40%. Additionally, embodiments employing a heat collector 210 should provide even more reduction of thermal resistance for larger chips.

It should further be noted that the heat spreader 200 need not be used with the asterisk-like leadframe 160, but can advantageously be used with many other leadframes. Likewise, the asterisk-like leadframe 160 of embodiments can be used without the heat spreader 200. However, the preferred implementation is to use both the heat spreader 200 and the asterisk-like leadframe 160 as disclosed herein.

It will be appreciated that various of the above-disclosed and other features and functions, or alternatives thereof, may be desirably combined into many other different systems or applications. It will also be understood that various presently unforeseen or unanticipated alternatives, modifications, variations or improvements therein may be subsequently made by those skilled in the art which are also intended to be encompassed by the following claims.

What is claimed is:

1. A packaged semiconductor comprising a die with a bottom surface attached to a plurality of die attach areas, a plurality of leads with first regions disposed under the die and providing the die attach areas that thermally connect the die to the plurality of leads, the first regions being spaced apart from one another by a molding compound encasing edges of the first regions while leaving a lower surface of the leads exposed, at least one electrical connection between the die and at least one of the leads, and a heat spreader thermally connected to the plurality of leads, the heat spreader comprising a planar cap disposed over the die, and at least one connecting projection extending downwardly from the cap thermally connecting the cap to the plurality of leads, the molding compound being disposed between the leads and cap of the heat spreader so as to encapsulate the die, the electrical connection, and an upper surface of the leads while leaving the lower surface of the leads and a top surface of the cap exposed.

2. The packaged semiconductor of claim 1 further comprising at least one heat collector extending from an edge of the cap.

3. The packaged semiconductor of claim 1 further comprising at least one heat collector with a centrally disposed projection extending from the cap toward the die.

4. The packaged semiconductor of claim 1 further comprising at least one heat collector extending from the cap toward the leads, wherein a heat path comprises the at least one heat collector and the cap.

5. The packaged semiconductor of claim 4 wherein the at least one heat collector comprises at least one additional projection extending from an edge of the cap toward the leads.

6. The packaged semiconductor of claim 4 wherein the at least one heat collector comprises a substantially central projection extending toward the die.

7. The packaged semiconductor of claim 6 further comprising a gap between the substantially central projection and the die.

8. The packaged semiconductor of claim 1 wherein a heat path comprises the die, the first regions of the leads over which the die resides, the leads, the at least one connecting projection, and the top surface of the cap.

9. The packaged semiconductor of claim 1 wherein the at least one electrical connection between the die and the leads is at least one bonding wire and the molding compound encapsulates the at least one bonding wire.

10. The packaged semiconductor of claim 1 wherein a heat path comprises the die, the first regions of the leads over which the die resides, and each respective lead.

11. A heat spreader for a semiconductor device comprising a planar cap from which multiple heat collectors downwardly extend to end in a first plane, the multiple heat collectors surrounding a die attach area, at least one connecting projection downwardly extending from the cap to end in a second plane that is spaced apart from, but parallel to, the first plane, the connecting projection being longer than the heat collectors, and the heat spreader providing a heat path passing through the heat collectors and the cap.

12. The heat spreader of claim 11 wherein the collectors comprise at least one additional projection extending from at least one edge of the cap.

13. The heat spreader of claim 12 wherein the at least one additional projection is stamped into right angle projections extending from the at least one edge of the cap.

14. The heat spreader of claim 11 wherein the heat path further comprises at least one connecting projection.

15. The heat spreader of claim 11 wherein the heat collectors comprise a substantially central projection extending from a bottom surface of the cap in a same direction as the at least one connecting projection.

16. The heat spreader of claim 15 wherein the substantially central projection extends toward a die leaving a gap between an end of the substantially central projection and a top of the die.

17. The heat spreader of claim 15 wherein the substantially central projection is cylindrical.

18. The heat spreader of claim 15 wherein the substantially central projection has a rectangular cross section.

19. The heat spreader of claim 11 further comprising fins projecting from a top surface of the cap opposite a bottom surface from which the at least one connecting projection and the multiple heat collectors extend.

20. The heat spreader of claim 11 wherein the at least one connecting projection is configured for attachment to and thermal communication with a leadframe.

21. A premolded leadframe including the heat spreader as recited in claim 11 further comprising a die, a plurality of leads, each lead having a first region disposed under the die that thermally connects the bottom of the die to the lead, each first region being spaced apart from the others by a molding compound encasing edges of the first regions while leaving a lower surface of the leads exposed.

22. The leadframe of claim 21 wherein each lead comprises a portion that extends downward so that a surface of the lead is exposed on a bottom of a completed semiconductor device including the leadframe.

23. The leadframe of claim 21 wherein the first region of at least one lead is enlarged relative to the remainder of the lead.

24. The leadframe of claim 21 wherein the plurality of leads comprises six leads forming an asterisk-like pattern.

25. The leadframe of claim 21 wherein the plurality of leads are supported by a frame via tie bars.

26. The leadframe of claim 25 wherein the plurality of leads comprises two sets of leads.

27. The leadframe of claim 25 wherein the molding compound is present between the plurality of leads and the frame.

* * * * *